(12) United States Patent
Tabatowski-Bush et al.

(10) Patent No.: US 10,023,112 B2
(45) Date of Patent: Jul. 17, 2018

(54) BATTERY JOINT MONITORING METHOD AND ASSEMBLY

(71) Applicant: FORD GLOBAL TECHNOLOGIES, LLC, Dearborn, MI (US)

(72) Inventors: Benjamin A. Tabatowski-Bush, South Lyon, MI (US); George Albert Garfinkel, Westland, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 275 days.

(21) Appl. No.: 14/694,175

(22) Filed: Apr. 23, 2015

(65) Prior Publication Data

US 2016/0311369 A1   Oct. 27, 2016

(51) Int. Cl.
| | |
|---|---|
| *B60Q 9/00* | (2006.01) |
| *G01R 31/04* | (2006.01) |
| *H02J 7/14* | (2006.01) |
| *B60L 3/00* | (2006.01) |
| *B60L 11/14* | (2006.01) |
| *B60L 11/18* | (2006.01) |
| *G01R 31/36* | (2006.01) |
| *H02J 7/00* | (2006.01) |

(52) U.S. Cl.
CPC .............. *B60Q 9/00* (2013.01); *B60L 3/0046* (2013.01); *B60L 11/14* (2013.01); *B60L 11/1879* (2013.01); *G01R 31/04* (2013.01); *G01R 31/3606* (2013.01); *H02J 7/1461* (2013.01); *B60L 2250/12* (2013.01); *G01R 31/3658* (2013.01); *G01R 31/3662* (2013.01); *H02J 7/0045* (2013.01); *Y02T 10/70* (2013.01); *Y02T 10/705* (2013.01); *Y02T 10/7005* (2013.01); *Y02T 10/7077* (2013.01)

(58) Field of Classification Search
CPC combination set(s) only.
See application file for complete search history.

(56) References Cited

U.S. PATENT DOCUMENTS

| | | | |
|---|---|---|---|
| 3,192,474 A | 6/1965 | Cherry | |
| 3,916,304 A | 10/1975 | Roemer et al. | |
| 6,225,810 B1 | 5/2001 | Godo et al. | |
| 8,531,305 B2 | 9/2013 | Lev et al. | |
| 2012/0286945 A1* | 11/2012 | Lev | G01R 31/04 340/438 |
| 2013/0187658 A1 | 7/2013 | Widhalm | |
| 2013/0187671 A1 | 7/2013 | Widhalm | |
| 2014/0203066 A1* | 7/2014 | Cai | B23K 20/10 228/102 |
| 2015/0143627 A1* | 5/2015 | McBride | A61H 3/008 5/81.1 R |

OTHER PUBLICATIONS

Schröer, Tony, and Jeff R. Snell, Testing and Verification of Intercell Welds, Digatron / Firing Circuits, pp. 1-16.

\* cited by examiner

*Primary Examiner* — Brian Zimmerman
*Assistant Examiner* — Cal Eustaquio
(74) *Attorney, Agent, or Firm* — Carlson, Gaskey & Olds, P.C.

(57) ABSTRACT

An exemplary method includes providing an alert in response to an analysis of an array that includes at least a first recorded value and a second recorded value, the first recorded value corresponding to an electrical parameter of a battery joint under a first set of operating conditions, the second recorded value corresponding to the electrical parameter of the battery joint under a second set of operating conditions.

16 Claims, 3 Drawing Sheets

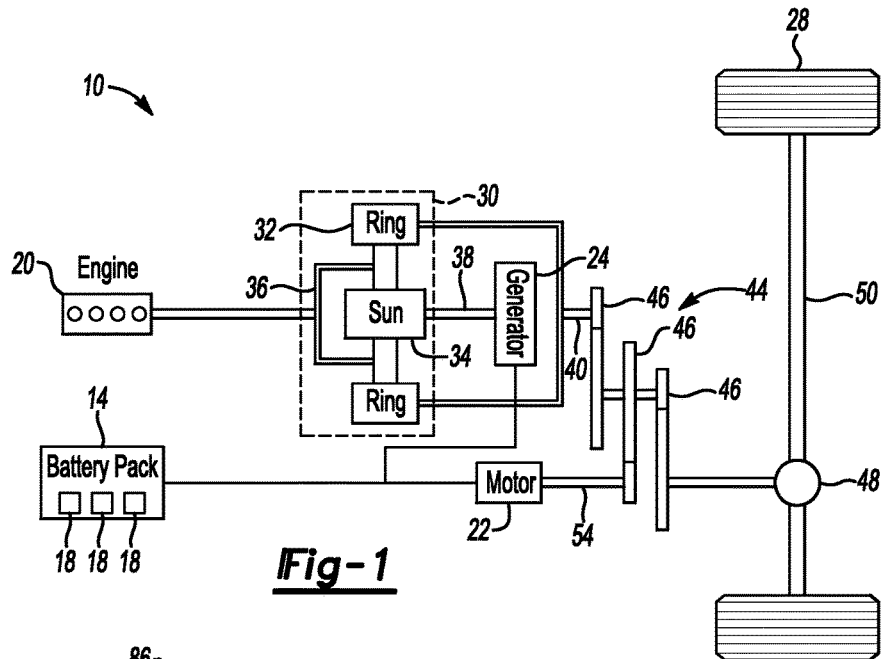
Fig-1
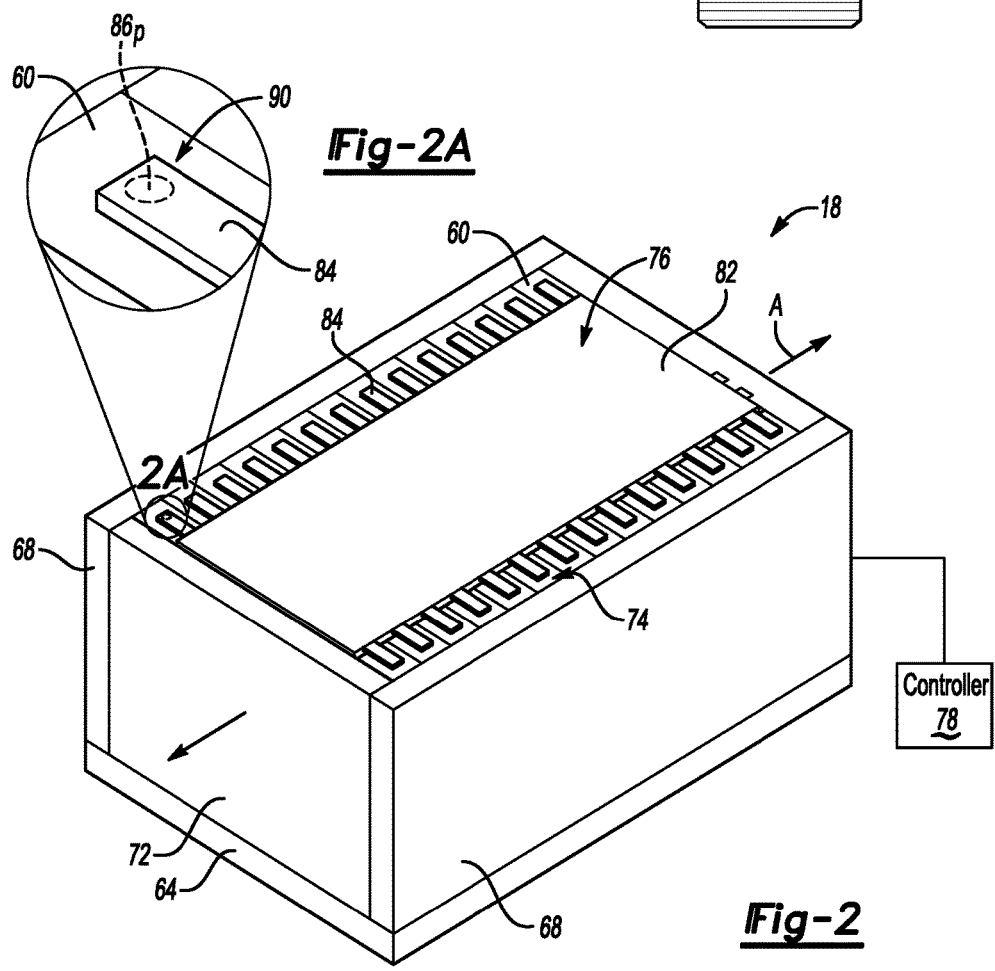
Fig-2A
Fig-2

BATTERY JOINT MONITORING METHOD AND ASSEMBLY

TECHNICAL FIELD

This disclosure relates to battery joints within electrified vehicles and, more particularly, to monitoring the battery joint using an electrical parameter.

BACKGROUND

Generally, electrified vehicles differ from conventional motor vehicles because electrified vehicles are selectively driven using one or more battery-powered electric machines. Conventional motor vehicles, in contrast to electrified vehicles, are driven exclusively using an internal combustion engine. The electric machines can drive the electrified vehicles instead of, or in addition to, an internal combustion engine. Example electrified vehicles include hybrid electric vehicles (HEVs), plug-in hybrid electric vehicles (PHEVs), fuel cell vehicles (FCVs), and battery electric vehicles (BEVs).

Electrified vehicles include one or more traction batteries that store power used to drive the electric machines. Busbars can transfer power to and from the traction batteries. The busbars can electrically connect to the traction battery at a battery joint. Temperature changes, mechanical vibrations, corrosion, loosening of mechanical fasteners, etc. can influence the integrity of the battery joint.

SUMMARY

A method according to an exemplary aspect of the present disclosure includes, among other things, providing an alert in response to an analysis of an array that includes at least a first recorded value and a second recorded value. The first recorded value corresponds to an electrical parameter of a battery joint under a first set of operating conditions. The second recorded value corresponds to the electrical parameter of the battery joint under a second set of operating conditions.

In a further non-limiting embodiment of the foregoing method, the electrical parameter is representative of a resistance of the battery joint.

In a further non-limiting embodiment of any of the foregoing methods, the electrical parameter is a resistance of the battery joint.

In a further non-limiting embodiment of any of the foregoing methods, the electrical parameter is representative of a maximum resistance of the battery joint.

In a further non-limiting embodiment of any of the foregoing methods, the alert indicates change in an integrity of a battery joint.

In a further non-limiting embodiment of any of the foregoing methods, the analysis includes an average of at least the first recorded value and the second recorded value.

In a further non-limiting embodiment of any of the foregoing methods, the method includes providing the alert in response to the average exceeding a threshold value.

In a further non-limiting embodiment of any of the foregoing methods, the array is a three dimensional array.

In a further non-limiting embodiment of any of the foregoing methods, a first dimension of the array is representative of a location of the battery joint, a second dimension of the array is representative of current at the battery joint, and a third dimension of the array is representative of temperature at the battery joint.

In a further non-limiting embodiment of any of the foregoing methods, a traction battery of an electrified vehicle provides at least a portion of the battery joint.

In a further non-limiting embodiment of any of the foregoing methods, the method further includes providing the alert during operation of the electrified vehicle.

In a further non-limiting embodiment of any of the foregoing methods, the method further includes providing the alert during manufacturing of the array and prior to installation of the array within an electrified vehicle.

An assembly according to an exemplary aspect of the present disclosure includes, among other things, a controller configured to initiate an alert in response to an analysis of an array that includes at least a first recorded value and a second recorded value. The first recorded value corresponds to an electrical parameter of a battery joint under a first set of operating conditions. The second recorded value corresponding to the electrical parameter of the battery joint under a second set of operating conditions.

In a further non-limiting embodiment of the foregoing assembly, the assembly includes a traction battery that provides at least a portion of the battery joint.

In a further non-limiting embodiment of any of the foregoing assemblies, the battery joint comprises a welded connection between a busbar and a terminal of a battery cell.

In a further non-limiting embodiment of any of the foregoing assemblies, the battery joint comprises a threaded connection between a busbar and a terminal of a battery cell.

In a further non-limiting embodiment of any of the foregoing assemblies, the electrical parameter is representative of a resistance of the battery joint.

In a further non-limiting embodiment of any of the foregoing assemblies, the alert indicates change in an integrity of a battery joint.

In a further non-limiting embodiment of any of the foregoing assemblies, the array is a three dimensional array.

In a further non-limiting embodiment of any of the foregoing assemblies, a first dimension of the array is representative of a location of the battery joint, a second dimension of the array is representative of current at the battery joint, and a third dimension of the array is representative of temperature at the battery joint.

DESCRIPTION OF THE FIGURES

The various features and advantages of the disclosed examples will become apparent to those skilled in the art from the detailed description. The figures that accompany the detailed description can be briefly described as follows:

FIG. 1 illustrates a schematic view of an example powertrain for an electrified vehicle.

FIG. 2 illustrates a perspective view of an array from a battery pack of FIG. 1 operably connected to a controller that is schematically shown.

FIG. 2A illustrates a close-up view of Area 2A in FIG. 2.

DETAILED DESCRIPTION

Figure 3:
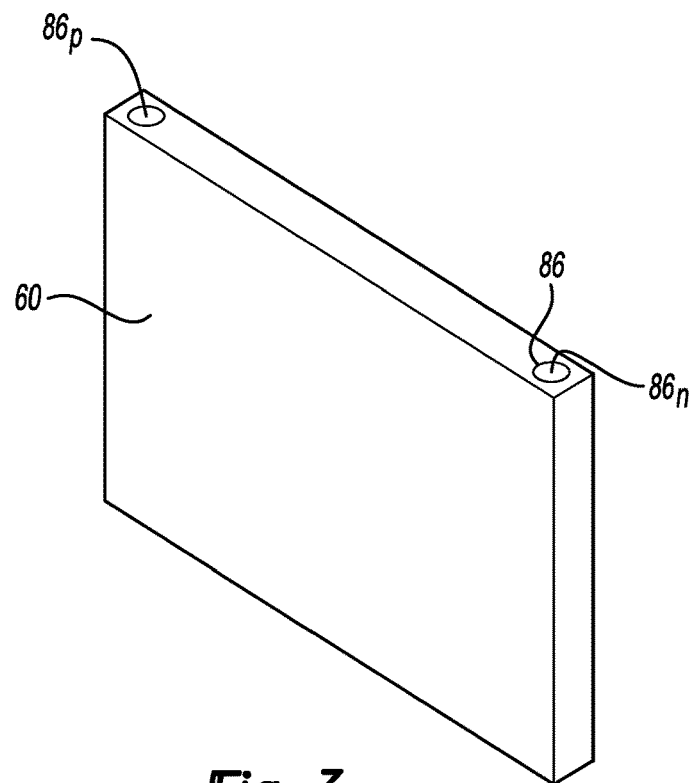
FIG. 3 illustrates a perspective view of a cell from the array of FIG. 2.

This disclosure relates generally to battery joints associated with traction batteries of electrified vehicles. More particularly, this disclosure relates to monitoring electrical parameters of the battery joint to determine if the integrity of the battery joint has been compromised.

Referring to FIG. 1, a powertrain 10 of a hybrid electric vehicle (HEV) includes a battery pack 14 having a plurality of battery assemblies 18, an internal combustion engine 20, a motor 22, and a generator 24. The motor 22 and the generator 24 are types of electric machines. The motor 22 and generator 24 may be separate or have the form of a combined motor-generator.

In this embodiment, the powertrain 10 is a power-split powertrain that employs a first drive system and a second drive system. The first and second drive systems generate torque to drive one or more sets of vehicle drive wheels 28. The first drive system includes a combination of the engine 20 and the generator 24. The second drive system includes at least the motor 22, the generator 24, and the battery pack 14. The motor 22 and the generator 24 are portions of an electric drive system of the powertrain 10.

The engine 20 and the generator 24 can be connected through a power transfer unit 30, such as a planetary gear set. Of course, other types of power transfer units, including other gear sets and transmissions, can be used to connect the engine 20 to the generator 24. In one non-limiting embodiment, the power transfer unit 30 is a planetary gear set that includes a ring gear 32, a sun gear 34, and a carrier assembly 36.

The generator 24 can be driven by the engine 20 through the power transfer unit 30 to convert kinetic energy to electrical energy. The generator 24 can alternatively function as a motor to convert electrical energy into kinetic energy, thereby outputting torque to a shaft 38 connected to the power transfer unit 30.

The ring gear 32 of the power transfer unit 30 is connected to a shaft 40, which is connected to the vehicle drive wheels 28 through a second power transfer unit 44. The second power transfer unit 44 may include a gear set having a plurality of gears 46. Other power transfer units could be used in other examples.

The gears 46 transfer torque from the engine 20 to a differential 48 to ultimately provide traction to the vehicle drive wheels 28. The differential 48 may include a plurality of gears that enable the transfer of torque to the vehicle drive wheels 28. In this example, the second power transfer unit 44 is mechanically coupled to an axle 50 through the differential 48 to distribute torque to the vehicle drive wheels 28.

The motor 22 can be selectively employed to drive the vehicle drive wheels 28 by outputting torque to a shaft 54 that is also connected to the second power transfer unit 44. In this embodiment, the motor 22 and the generator 24 cooperate as part of a regenerative braking system in which both the motor 22 and the generator 24 can be employed as motors to output torque. For example, the motor 22 and the generator 24 can each output electrical power to recharge cells of the battery pack 14.

Figure 4:
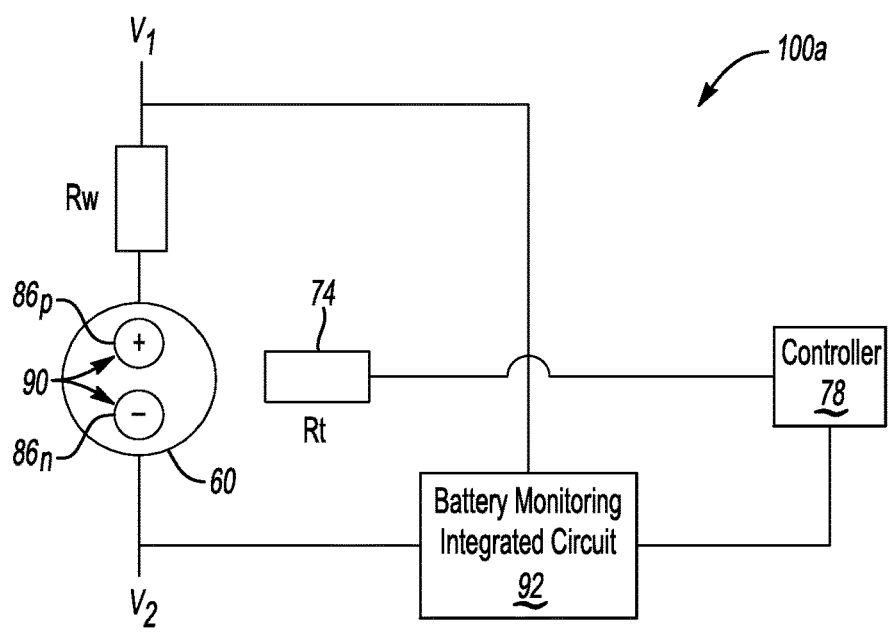
FIG. 4 illustrates a portion of a circuit that is used to monitor electrical parameters of at least one battery joint associated with one of the battery cells of the array.

Referring now to FIGS. 2 to 4 with continuing reference to FIG. 1, the example battery pack 14 includes one or more battery assemblies 18. The battery assemblies 18 include a plurality of battery cells 60 disposed on a heat exchanger plate 64. The cells 60 of a battery assembly 18 are disposed along an axis A.

The example battery pack 14 includes three battery assemblies 18. The battery pack 14 could include more than three battery assemblies 18 or less than three battery assemblies 18 in other examples.

The battery assembly 18 includes fourteen battery cells 60, but could include other numbers of cells 60. For example, a battery assembly of a full hybrid can include sixty battery cells, a battery assembly of a mild hybrid electrified vehicle can include twelve battery cells, and an battery assembly of a battery electric vehicle can include ninety-six battery cells. The cells 60 are lithium cells in this example, but could be of other chemistries.

The cells 60 of the battery assembly 18 are positioned laterally between a pair of sidewalls 68. The cells 60 are positioned, and clamped, axially between a pair of end walls 72. The cells 60 are prismatic cells in this example. Other types of cells could be used in other examples including, but not limited to, cylindrical cells and pouch cells.

The battery assembly 18 further includes thermistors 74 and a busbar assembly 76. A controller 78 is operably linked to portions of the battery assembly 18.

The thermistors 74 of the battery assembly 18 monitor temperatures. Measurements from the thermistors 74 can be used to calculate the temperatures of cells 60. Each cell 60 does not require an associated thermistor 74. Instead, some cells 60 of the battery assembly 18 can include thermistors 74, and the temperatures of remaining cells 60 can be estimated based on the measurements from those thermistors 74. Thermistors 74 could be located elsewhere within the battery assembly 18 and elsewhere within the battery pack 14.

For the example of prismatic cells, a busbar assembly 76 is positioned on top of the cells 60, which, again, are prismatic cells in this example. The busbar assembly 76 includes at least a housing 82 and a busbar 84. The busbar 84 can comprise a plurality of individual busbars.

The cells 60 include terminals 86 and, more specifically, a positive terminal $86_p$ and a negative terminal $86_n$. In this example, each of the cells 60 includes one positive terminal $86_p$ and one negative terminal $86_n$ at a vertical top surface of the cells 60. In other examples, one or both of the terminals $86_p$ and $86_n$ is located elsewhere on the cells 60. Thermistor locations could also be different than shown in FIG. 2

The busbars 84 attach to terminals 86 of the battery cells 60. This attachment can be referred to as a battery joint 90. Electrical energy moves between the battery cells 60 and the busbars 84 through the battery joint 90.

The busbar 84 is welded to the terminals 86 in this example. Thus, the battery joint 90 is a welded battery joint. One weld attaches the positive terminal $86_p$ to the busbar 84, and another weld attaches the negative terminal $86_n$ to the busbar 84.

In other examples, the connection between the busbar 84 and the terminals 86 is not welded. The connection can be, for example, a bolted joint that includes no welded portions. In such an example, a threaded connector extending from the positive terminal $86_p$ of the cell 60 could extend through an aperture in the busbar 84 to attach the terminals 86 to the busbar 84 and then be bolted to the busbar 84.

In some configurations of battery assemblies, the battery cells 60 can be placed in parallel and join together to make a unit of battery cells 60 sharing the same voltage and the same connections to the busbar 84. Three to five battery cells 60 could be placed in parallel, for example. This configuration of the battery pack 14 can be referred to as a parallel-series combination.

If a number of the battery cells 60 are joined in parallel and then stacked in a series string of parallel units, the pack current will divide across the battery cells 60 in parallel with each other.

Depending on the materials selected for the cells 60 and the busbar 84, the battery joint 90 may be a copper material connected to an aluminum material, an aluminum material connected to an aluminum material, a copper material connected to a copper material, or some other combination of materials.

The battery joint 90 for purposes of this disclosure, refers to welded connections, bolted connections, and other techniques of securing the battery cell 60 to the busbar 84.

As described above, the battery joint 90 is a connection between the terminal 86 and the busbar 84. The battery joint 90 could include other connections, however.

Another example of the battery joint 90 can include a connection between the busbar 84 and a busbar of another battery assembly 18 in the battery pack 14. Another example of the battery joint 90 can include connections between the busbar 84 from the battery assembly 18 and a bussed electrical center (BEC). Thus, the battery joint 90 can include connections other than the connections between the terminals 86 and the busbar 84.

The battery joint 90 has electrical parameters. Example electrical parameters include resistances, voltages, and current. The electrical parameters can be monitored.

In this example, the resistance of the battery joint 90 is monitored to identify issues with the battery joint 90. A faulty weld can cause issues with the battery joint 90, for example. Identifying the faulty weld is useful to, among other things, prompt a repair or inspection.

The resistance of the battery joint 90, and other electrical parameters of the battery joint 90, can depend on the material of the cell terminals 86 and the material of the busbar 84. If the battery joint 90 is a welded battery joint, the electrical parameters can vary based on the type of welding used to connect the cell terminal to the busbar 84. For example, laser welding, vibration welding, ultrasonic welding, soft beam welding, etc. can result in the battery joint 90 having a different resistance $R_w$ under similar operating conditions.

Referring now to FIG. 4 with continued reference to FIGS. 2 to 3, a circuit portion 100a includes a battery cell 60 of the battery assembly 18 and at least one battery joint 90. In this example, the battery cell 60 include one battery joint 90 associated with the positive terminal 86$_p$, and one battery joint 90 associated with the negative terminal 86$_n$.

The controller 78 is configured to monitor the resistance $R_w$ through the battery joints 90 of the battery cell 60. In this example, the resistances for the two battery joints 90 of each battery cell 60 are monitored and lumped together as a single lumped resistance $R_w$. The resistance $R_w$ would increase if the resistance associated with the positive terminal 86$_p$ increases, the negative terminal 86$_n$ increases, or if the resistance associated with both the positive terminal 86$_p$ and negative terminal 86$_n$ increases.

In the parallel-series configuration, a parallel grouping of battery cells 60 can have a single measurement point. In a series grouping of battery cells, each of the battery cells 60 can have a single associated measurement point.

The controller 78 also monitors a temperature $R_t$ of the cell 60. One of the thermistors 74 can be directly connected to the cell 60 to provide the temperature $R_t$. The temperature $R_t$ could also be an estimate of the temperature of the cell 60 that is based on temperature measurements from other areas of the battery assembly 18. In some full hybrid vehicles, a battery assembly includes only six thermistors.

Wires 80 extend between the thermistor 74 and controller 78. A thermistor receive circuit (not shown), which can be as simple as a pullup resistor to a 5 Volt supply, can connect to one of the wires 80 as a ground reference wire.

In this example, the thermistor 74 and the pullup resistor form a resistive divider. The controller 78 is able to read the voltage of this divider via an Analog to Digital converter portion of the controller 78.

A lookup table or a formula can be used by the controller 78 to convert this voltage from the thermistor 74 to a temperature in engineering units, such as degrees centigrade.

Temperature information from thermistors has been utilized to detect an unusual temperature rise in the battery assembly 18 associated with a high resistance in a battery joint 90. Identifying high resistance in this way may not be optimal for pinpointing a location of a compromised battery joint, and can lack the sensitivity required for early detection of a compromised battery joint.

The circuit portion 100a also monitors voltages associated with the battery cell 60. In this example, a battery monitoring integrated circuit (BMIC) 92 can measure the voltage between a first lead $V_1$ and a second lead $V_2$. The measured voltages from the leads $V_1$ and $V_2$ are provided to the controller 78.

The controller 78 is a master microcontroller in this example. The controller 78 includes a memory portion for storing control software and data.

Figure 5:
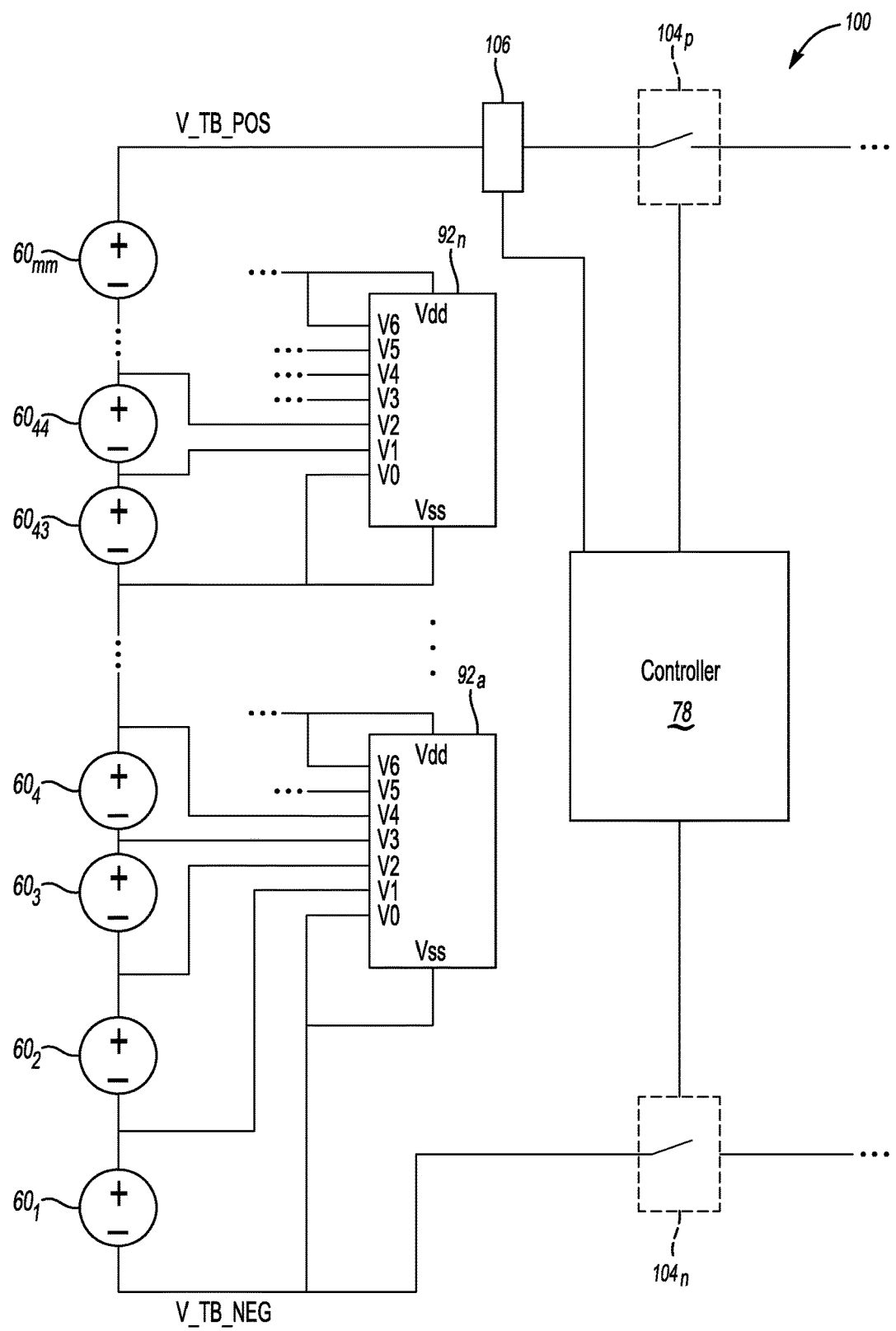
FIG. 5 illustrates an expanded view of the circuit of FIG. 4.

Referring to FIG. 5 with continuing reference to FIGS. 2 to 4, a circuit 100 for the battery assembly 18 incorporates the circuit portion 100a. A single pack current flows from V_TB_NEG to V_TB_POS. Normally open contactors 104$_p$ and 104$_n$ are coupled to the controller 78 and used to selectively stop current flow through the circuit 100.

The individual battery cells 60 of the battery assembly 18 are represented in a circuit 100 as battery cells 60$_1$, 60$_2$, 60$_3$, ... 60$_{mm}$. The battery cells 60$_1$-60$_{mm}$ are connected in series. The resistances and temperatures for each of MM battery cells 60 in the battery assembly 18 are monitored by the controller 78. The variable MM is the number of cells 60 in the battery assembly.

The circuit 100 includes a plurality of BMICs 92a-92n to monitor voltages at different positions within the battery assembly 18. Each BMIC 92a-92n is a 6-channel BMIC in this example. The input pins of the BMICs 92a-92n can accommodate six input voltages. Ten total BMICs are used in this example for MM=60 cells. In other examples, BMICs could include other numbers of input pins and accommodate other numbers of input voltages.

The way that cell 60$_{mm}$ connects to BMIC 92$_n$ by connecting one lead of, for example, monitor pin V6 on BMIC 92$_n$, to the positive (+) pin on cell 60$_{mm}$, and the next lower input pin (V5) on BMIC 92$_n$ to the negative (−) terminal on cell 60$_{mm}$. Notice that pins V6 and V5 on BMIC 92$_n$ are to the highest input voltage channel on BMIC 92$_n$. This is how the BMIC 92$_n$ measures a stack of voltages such as those found on cells 60 of the battery assembly 18.

To monitor an additional battery joint, such as a busbar extension, etc., the weld joint to be monitored will be treated like cell 60$_{mm}$ in FIG. 1. That is, the two leads connected to pins V6 and V5 on BMIC 92$_n$ will be arranged around the battery joint to be monitored in the same way as they are on the cell 60$_{mm}$. V6 will be connected to the side of the battery joint on the side toward the vehicle, and V5 will be connected to the side of the weld joint toward the cell stack. What will happen is that a voltage will be developed when current flows across the battery joint. This battery joint voltage will get applied to the top channel of BMIC 92$n$ which corresponds to the V5 and V6 input pins.

The circuit 100 further includes a current sensor 106 that measures current through the circuit 100.

The circuit 100 is used to monitor electrical parameters of the battery joints 90. In this example, resistance is the monitored electrical parameter. If the battery joint 90 is relatively high quality, the Ohmic resistance may be, for example, two microohms, with an expected variation of Ohmic resistance from one microohm to three microohms.

In such an example, the mean resistance of the battery joint 90 would be two microohms, with a standard deviation of 0.167 microohms. The population of potential resistances representing an acceptable quality for the battery joint 90 would then be two microohms+/−6σ.

A resistance Rw that falls outside this population of resistances can indicate that one of the battery joints 90 within a particular battery cell 60 has been compromised. For example, if the resistance Rw for one of the battery joints 90 increases beyond three microohms, this condition may indicate a diminished quality or integrity of the battery joint 90.

Temperature changes, mechanical vibrations, corrosion, etc. can result in diminished integrity of the battery joint 90. If the battery joint 90 is a mechanically fastened joint, loosening of the joint may result in a diminished integrity. A battery joint 90 having diminished integrity can result in damage to various components within a vehicle having the powertrain 10.

The assembly and method of this disclosure can monitor electrical parameters of the battery joint 90 to identify diminished integrity of the battery joint 90. In some examples, an alert is provided to, for example, a driver or technician, indicating that the battery joint 90 requires inspection or repair.

In this example, electrical parameters of the battery joint 90 are stored within an array data structure within a memory portion of the controller 78. In this example, the array data structure is multidimensional and includes three dimensions to categorize the monitored electrical parameters. The electrical parameter of the battery joint is resistance in this example, and the array data structure is referred to as RESISTANCE_ARRAY.

A first variable of the RESISTANCE_ARRAY is representative of a location of the battery joint 90 within the battery assembly 18, such as a battery cell number. A second variable of the RESISTANCE_ARRAY is representative of current at the battery joint 90. A third variable of the RESISTANCE_ARRAY is representative of temperature of the battery joint 90.

During operation, the controller 78 continually collects resistance measurements for the battery joints 90 of the battery assembly 18. The resistance measurement is then compared to a resistance measurement stored in the RESISTANCE_ARRAY for that particular combination of battery joint location, current and temperature. If the collected resistance measurement exceeds the resistance value that is stored in the RESISTANCE_ARRAY, the newly collected resistance measurement overwrites the resistance value stored in the RESISTANCE_ARRAY. Thus, the RESISTANCE_ARRAY is populated with maximum observed resistances for the battery joints 90 at various combinations of current and temperature.

The RESISTANCE_ARRAY is populated with resistance measurements for the battery cells $60_1$-$60mm$ of the battery assembly 18. The example RESISTANCE_ARRAY includes a record of a maximum value of weld resistance as a function of current and temperature for each cell $60_1$-$60mm$. The weld resistance for each of the cells $60_1$-$60mm$ represents a sum of the resistances for the battery joints 90 within each one of the cells $60_1$-$60mm$.

If the electrical parameter falls outside an acceptable value for the electrical parameter, an alert can be provided. A technician can inspect the battery assembly 18 in response to the alert.

The resistance values stored within RESISTANCE_ARRAY can be analyzed to determine whether or not the alert should be provided. Analysis of the RESISTANCE_ARRAY can include, for example, generating a best fit line of the resistance as a function of current.

If, as here, resistance is the electrical parameter populating RESISTANCE_ARRAY, the resistance can be noisy at low current values as the signal to noise ratio of the resistances can be limited by the cell voltage read accuracy of the BMICs $92a$-$92n$.

The electrical noise can decrease as the RESISTANCE_ARRAY is populated with additional resistance measurements. If, for example, one entry has a positive error due to noise, the next entry at a different current level may have a negative error associated with noise. When averaged, the errors due to noise cancel out.

Since resistance is a linear resistance, the resistance for the battery cells $60_1$-$60n$ should not vary with current variations. Therefore, an estimate of actual resistance through the battery joints 90 of the battery cells $60_1$-$60mm$ at a given temperature can be determined by averaging all of the resistance values for that a battery joint 90 over all current bins of the array data structure.

This estimate provides an average resistance over a range of operating currents. The average resistance has a reduced signal to noise ratio as the average resistance is taken over a number of operating currents. Essentially, the averaging reduces the noise within the measurement of resistance.

In the prior art, error bands were associated with resistance measurements to allow for temperature variation. In the example disclosure, the temperature information is captured as the resistance values are populated within the RESISTANCE_ARRAY, which effectively eliminates temperature as a noise factor.

The size of the first dimension is the total number of battery cells 60 (MM), which, in this example, each include two battery joints 90, plus any other battery joints 90 requiring monitoring.

The second dimension of the example array corresponds to current ranges of the battery pack 14. In this example, the size of this second dimension is ten.

The first index position for the second dimension includes currents in the lowest 10% of the operating range for the current sensor 106. The next index corresponds to the next 10% of the operating range for the current sensor 106. The remaining bins cover the remaining portions of the operating range for the current sensor 106 in 10% increments.

If the example current sensor 106 is a 200 amp current sensor, the ten bins for the second dimension can be represented as shown below in Table I.

TABLE I

INSTANTANEOUS CURRENT AMOUNT VS. BIN NUMBER

| BIN | 1 | 2 | 3 | 4 | 5 | 6 | 7 | 8 | 9 | 10 |
|---|---|---|---|---|---|---|---|---|---|---|
| AMP RANGE | −200 TO −161 | −160 TO −121 | −120 TO −81 | −80 TO −41 | −40 TO −1 | 0 TO 39 | 40 TO 79 | 80 TO 119 | 120 TO 159 | 160 TO 200 |

More bins could be used as desired, or a current sensor with a wider range could be used if desired.

The third dimension of the RESISTANCE_ARRAY corresponds to temperature. In the example array, ten bins are provided corresponding to a typical temperature range for the battery cells 60 during operation.

An example binning strategy for temperature across the typical temperature range for the battery cells 60 during operation is shown below in Table II.

TABLE II

INSTANTANEOUS TEMPERATURE AMOUNT VS. BIN NUMBER

| BIN | 1 | 2 | 3 | 4 | 5 | 6 | 7 | 8 | 9 | 10 |
|---|---|---|---|---|---|---|---|---|---|---|
| DEGREES CELSIUS | −40 TO −31 | −30 TO −21 | −20 TO −11 | −10 TO −1 | 0 TO 9 | 10 TO 19 | 20 TO 29 | 30 TO 39 | 40 TO 49 | 50 TO 60 |

Other temperature ranges or binning strategies for temperature could be developed if desired.

Monitoring temperature of the battery cells 60 and other areas of the battery assembly 18 can be accomplished utilizing the thermistors 74. In some examples, a thermal model for the battery assembly 18 is used to estimate a temperature at a particular one of the battery cell 60. The thermal model can utilize actual measurements from the thermistors 74 and measurements of watts burned in the battery cells 60.

The temperature measurements from the thermistors 74 and the power measurements in watts are then utilized as inputs to create a time variant estimation of a temperature for each of the battery cells 60.

Referring again to the RESISTANCE_ARRAY for the battery assembly 18, the RESISTANCE_ARRAY would include 6,200 individual array data cells. This RESISTANCE_ARRAY is representative of the battery assembly 18 having MM=sixty battery cells 60 and two additional battery joints 90. This example RESISTANCE_ARRAY further includes the ten bins for current and the ten bins for temperature. The 6,200 array data cells is determined by multiplying the MM=sixty battery cells 60 plus the two additional battery joints 90, times the ten current bins, and then times the ten temperature bins as shown below:

6,200 array data cells=(60+2 battery joints)*10 current bins*10 temperature bins For an exemplary implementation where an estimated temperature for the tenth battery cell is 5 degrees Celsius when the pack current is +100 Amps, then the correct place to store an estimation of the resistance $R_w$ for the tenth battery cell is RESISTANCE_ARRAY[10, 8, 5].

The index for the tenth battery cell 60 is 10. If the estimated temperature for the tenth battery cell 60 changes, the resistance $R_w$ is stored in a different spot in the array. If the pack current changes, the resistance $R_w$ is stored in a different spot in the array.

A measured zero current voltage is used as the input to record the resistance $R_w$ in the RESISTANCE_ARRAY. This is because the estimate for the resistance is, for a given input, at a moment where the current is non-zero. The resistance estimate $R_w$ is calculated using Equation I below:

$$R_w = (V\_CS\_Measurement - Zero\_Current\_Voltage / Pack\_Current) \quad \text{EQUATION I:}$$

In EQUATION I, V_CS_Measurement is the instantaneous input voltage measurement measured by the BMICs 92a_92n. The Zero_Current_Voltage is the estimator of the input voltage at zero current, and the pack current is the instantaneous pack current at a time when the pack current is non-zero.

The resistance estimate $R_w$ is recorded in the RESISTANCE_ARRAY if the resistance measurement is the maximum value of resistance observed for this input at the current operating point. That is, for a given battery cell 60, the resistance estimate $R_w$ overwrites the existing resistance measurement $R_w$ stored within the cell of the RESISTANCE_ARRAY if the newly measured resistance estimate $R_w$ is greater than the resistance estimate $R_w$ currently stored within the cell.

The resistance estimate $R_w$ is calculated in this way so that relatively instantaneous measurements of instant input voltages can be compared to input voltages measured when the pack current is near zero. The zero current voltage is defined, in this example, as the input voltage measured by the BMICs 92a-92n at a time when the current for the battery assembly 18 (or the pack current) is near zero amps.

By taking a measurement at a time when the current for the battery assembly 18 is larger, the newly measured input voltage can be compared to the original zero current voltage reading. The difference will be accounted for by the voltage drop in resistance. Ohm's Law can then be used to obtain the estimated resistance by knowing this change in voltage and pack current.

In some examples, the resistance estimate $R_w$ is filtered prior to entry into the RESISTANCE_ARRAY. For example, by applying digital averaging technique to the resistance estimate $R_w$, a $R_w$_ESTIMATE_Filtered can be determined.

Ordinarily, a vehicle having the battery assembly 18 will dwell at a particular operating point of Pack Current for several samples, which permits digitally filtering of the collected resistance estimates $R_w$. The collected resistance estimates $R_w$ are then used to establish the $R_w$_ESTIMATE_Filtered, which represents an average of several resistance estimates Rw taken at close to the same pack current.

If the operation is such that just a few samples get taken at a particular operating point of pack current and there is not enough data to perform this averaging, then the variable $R_w$_ESTIMATE_Filtered can be marked as INVALID so that no further operations will be performed on the data.

The Zero_Current_Voltage of a particular battery cell 60 can change during operation. To calculate Equation I, the actual Zero_Current_Voltage is determined using a single dimensional array that is defined as: ZEROCURRENT_VOLTAGE_ARRAY[InputNum]

This is a one dimensional array that has its size determined by MM+x where MM is the number of battery cells 60 and x is the number of Zero_Volt_Average inputs. The InputNum is an index whose value is 1 through MM+x. This single dimensional array hold the input voltage at zero current for cell index 1 through MM+x.

The ZEROCURRENT_VOLTAGE_ARRAY can be initialized during the boot time of the controller 78 when the contactors 104$_n$ and 104$_p$ are open and the pack current is zero. At this time, whatever the input voltages are for indexes 1 to MM+x on the BMICs 92a-92n are read by the BMICs 92a-92n and communicated to controller 78. These voltages are now stored in ZEROCURRENT_VOLTAGE_ARRAY.

The ZEROCURRENT_VOLTAGE_ARRAY is periodically updated so that the ZEROCURRENT_VOLTAGE_ARRAY does not contain information that is older than, for instance, a minute old. This periodic update to the ZEROCURRENT_VOLTAGE_ARRAY will account for many items which will cause variation in the zero current voltage, such as aging of the battery assembly 18, changes to the Open Circuit Voltage of the battery cells 60 as a function of State of Charge (SOC), temperature effects, etc.

In this example, if the values in the ZEROCURRENT_VOLTAGE_ARRAY are older than one minute, the controller 78 monitors the pack current using the current sensor 106. If the pack current is then, for instance, below 1 amp in magnitude, the controller 78 will read the BMICs 92a-92n to obtain updated values for all of the entries in ZEROCURRENT_VOLTAGE_ARRAY.

The above technique could be modified in some situations, such as during plug-in charging of a plug-in vehicle. During this charging there can be relatively long durations where the pack current does not ordinarily fall to zero. So, in order to get the above technique to work for the plug-in charging use case, the charging could be programmed to stop an cause the charge current to fall to zero amps every so many minutes, for instance once per hour.

At this time when the current is zero, the ZEROCURRENT_VOLTAGE_ARRAY will be updated based on inputs from the BMICs 92a-92n. When performing the update, the control software in controller 8 can apply an averaging technique between the existing stored data and the new input information to help eliminate the effect of electrical noise and the limit fast changes. By following the above techniques, the ZEROCURRENT_VOLTAGE_ARRAY can be consider to contain voltage readings which can be confidently used for comparison in the R+ determination as demonstrated in Equation I.

Referring again to the RESISTANCE_ARRAY, the measurements of historical maximum $R_w$ stored within RESISTANCE_ARRAY can help in diagnosing a compromised battery joint.

To diagnose the battery joints 90 using the RESISTANCE_ARRAY, the circuit 100 is used to measures all of the input voltages via BMICs 92a-92n for the battery cell 60 and Zero-Volt-Average inputs, at specific moments in time. These measurements can be coordinated with the reading of pack current from the current sensor 106.

The memory array ZEROCURRENT_VOLTAGE_ARRAY[InputNum] is initialized and periodically updated to contain valid estimations of the voltage of the input at zero current.

At the rate which battery cell 60 information is gathered by the BMIC 92a-92n, for instance 100 ms, the controller 78 iterates through all of the inputs for the BMICs 92a-92n. The controller 78 iterates from 1 through (MM+x). This variable can be referred to as InputNum.

For each input for the BMICs 92a-92n, the controller 78 will identify the correct bin in the RESISTANCE_ARRAY for pack current via Table I, which is an integer from 1 to 10 in this and example and referred to as CurrentBin.

The controller 78 will further identify the correct bin for the temperature for the given input number. The temperature may be a calculated value based on a number of weighted thermistor input values and applying the estimated value to Table II. The temperature bin number is referred to as TempBin.

With these three index values InputNum, CurrentBin, and TempBin, the resistance measurements $R_w$ can be indexed to a specific value in the RESISTANCE_ARRAY[InputNum, CurrentBin, TempBin].

When the module was manufactured, values were initialized into the array which were calculated from a worst case analysis as the maximum specified $R_w$ for the given temperature and current. Now at every timestep, we calculate $R_w$_ESTIMATE from Equation I. Notice that it does so as a function of instantaneous input voltage, the instantaneous pack current, and the present value of ZEROCURRENT_VOLTAGE_ARRAY[InputNum].

An exemplary program for carrying out the above can include at least the following steps for the InputNum between 1 and MM+x {

```
Obtain R_w_Estimate from Equation 1
Obtain TempBin via calculation from Thermistor inputs
If
(R_w_ESTIMATE_Filtered is VALID
AND
R_w_ESTIMATE_Filtered > RESISTANCE_ARRAY [InputNum,
CurrentBin, TempBin])Then
{ store R_W_ESTIMATE into RESISTANCE_ARRAY[InputNum,
CurrentBin, TempBin}
Else
{do not store}
}
```

A number of statistical techniques could be performed on this RESISTANCE_ARRAY to identify whether one or more of the battery joints 90 are compromised, or whether one or more of the battery cells 60 includes battery joints 90 that are compromised.

One such technique can be termed: OVERALL AVERAGE TECHNIQUE. Again, the RESISTANCE_ARRAY is populated with the highest resistances for each operating point. The resistances within the RESISTANCE_ARRAY thus can only increase if the measured value dictates it. The RESISTANCE_ARRAY can be averaged as shown below to provide $R_w$OverallAverage.

$$R_w OverallAverage = \frac{1}{(MM+x)*10*10}$$

$$\sum\nolimits_{k=1}^{MM+x} \sum\nolimits_{l=1}^{10} \sum\nolimits_{m=1}^{10} \text{RESISTANCE\_ARRAY } [k, l, m]$$

A target or threshold value for $R_w$OverallAverage can be set as an initialization value, which are preloaded into RESISTANCE_ARRAY during manufacturing.

When a battery joint 90 is compromised, it will tend to increase the $R_w$OverallAverage. The wider the current operating range that is used and the wider the temperature range that is used, the more that the $R_w$OverallAverage will be affected.

The $R_w$OverallAverage can be continually monitored and an alert can be provided if the $R_w$OverallAverage exceeds threshold values. For example, an AVERAGE_TRIPPOINT_ MILD threshold value can be chosen so that if $R_w$OverallAverage exceeds the AVERAGE_TRIPPOINT_ MILD value, a mild fault action can be taken. Example mild fault actions include setting a Diagnostic Trouble Code (DTC) and lighting a light in the vehicle instrument panel.

An AVERAGE_TRIPPOINT_MEDIUM threshold value can be chosen so that if $R_w$OverallAverage exceeds the AVERAGE_TRIPPOINT_MEDIUM value, a medium fault action can be taken. Example medium fault actions include dropping power limits for the battery pack 14 or the battery assembly 18.

An AVERAGE_TRIPPOINT_SEVERE threshold value can be chosen so that if the $R_w$OverallAverage exceeds the AVERAGE_TRIPPOINT_SEVERE value, a severe fault action can be taken. An example severe fault action includes a Battery Power Off (BPO.)

These AVERAGE_TRIPPOINT values could also be adjusted based on battery assembly 18 age, such that for newer battery assemblies 18, the resistance estimate is different than the resistance estimate for an older battery assembly.

The adjustment could include a multiplier coefficient applied to the AVERAGE_TRIPPOINT that is controlled based on the time in service for the battery assembly 18. The adjustment could allow a narrower prediction band through the life of the battery assembly 18. Otherwise, the band would be wider at the beginning of life to account for aging, making it less effective for earlier predictions.

Notably, the adjustment is progressive as is the usual case of a battery joint that starts out OK and then degrades over time, The fault management action is thus progressive as well.

Other statistical techniques could be applied that create a statistical metric based on certain subsets of the RESISTANCE_ARRAY, such the mean and standard deviation for the $R_w$ over the entire battery assembly 18 and over the current operating points. A given operating point could be compared against the mean plus 6σ. If a given input is above the mean plus 6σ point for the present conditions, then fault action could be taken.

A statistical technique could be applied for the end-of-line pack tester, which is the functional tester that is used to check the operation of the battery pack 14 at the time of its manufacture.

During manufacture, the terminals 86 can be welded to the busbars 84, the controller 78 with its associated harnesses are then connected. The busbar housing 82 is then secured and the battery assemblies 18 are positioned within the battery pack 14. At this point, the battery pack 14 can be treated as a single component that is ready to go to the vehicle assembly plant. Before shipping the battery pack 14, an end-of-line tester can be used to functionally check the battery pack 14.

During the end-of-line test, the end-of-line tester has the capability of charging the battery pack 14 at full current magnitude, which is, for example, the maximum amount of current that the battery pack 14 is expected to see in use. The end-of-line tester can also discharge the battery pack 14 at maximum discharge current.

A test profile programmed into the end-of-line tester will successively charge and discharge the pack at maximum current, but with a balanced profile so as to leave the final state of charge on the battery pack 14 at the desired value for shipping, and as well to avoid overcharging or overdischarging the battery pack 14.

The battery pack 14 is thus run at a very high level of current at both charging and discharging. This will cause the maximum level of current to flow through all of the battery joints 90. This test profile will have a duration sufficient to take the battery joints 90 up to their maximum expected joint temperature. Certain considerations will need to be applied in the end of line test in the case where testing occurs without the active cooling system hooked up to the pack. That is because it can be more convenient for manufacturer not to connect the cooling system during the test. So, in this case, the maximum current capability is much lower for testing. However, the magnitude of current and applied duration, which are chosen for the pack End-Of-Line testing are still selected in such a way as to get the joints up to their maximum expected temperature.

At this time, the methods of this disclosure can be employed in order to calculate $R_w$OverallAverage of the battery pack 14 and the end-of-line tester. This number is compared to the trip point AVERAGE_TRIPPOINT_MILD, which is the lowest level of failure. If the $R_w$OverallAverage is lower than AVERAGE_TRIPPOINT_MILD, then the battery pack 14 is considered acceptable and appropriate for shipping. If the $R_w$OverallAverage exceeds AVERAGE_TRIPPOINT_MILD after the test, this indicates that battery joints 90 of the battery pack 14 being tested may be compromised.

This method of end-of-line testing can be used for the battery assembly 18 or the battery pack 14. A special version of the BECM code can be developed to work on a subset of battery cells 60 within the battery assembly 18. Later on, when assembling battery assemblies 18 into the battery pack 14, the method could better focus on other battery joints 90, such as array-to-array or array-terminal-to-busbar welds, or any other joint outside the array welds.

Another aspect of this disclosure a screening tool for pre-assembled battery assemblies coming from the cell supplier, where the methods of this disclosure could be utilized to check for supplier-made welds as a pre-pack assembly quality check—also with this special version of the BECM supporting the appropriate number of cell inputs.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. A method, comprising:
providing an alert in response to an analysis of an array that includes at least a first recorded value and a second recorded value, the first recorded value corresponding to an electrical parameter of a battery joint under a first set of operating conditions and positioned within the array according to the first set of operating conditions, the second recorded value corresponding to the electrical parameter of the battery joint under a second set of operating conditions and positioned within the array according to the second set of operating conditions; and updating the array by replacing the first recorded value with a new recorded value corresponding to the electrical parameter of the battery joint under the first set of operating conditions, wherein the array is a three dimensional array having a first dimension representative of a location of the battery joint, a second dimension representative of current at the battery joint, and a third dimension representative of temperature at the battery joint.

2. The method of claim 1, wherein the electrical parameter is representative of a resistance of the battery joint.

3. The method of claim 2, wherein the electrical parameter is a resistance of the battery joint.

4. The method of claim 1, wherein the electrical parameter is representative of a maximum resistance of the battery joint, and the first recorded value is replaced with the new recorded value if the new recorded value exceeds the first recorded value, the first recorded value and the new recorded value both corresponding to the first set of operating conditions.

5. The method of claim 1, wherein the alert indicates change in an integrity of a battery joint.

6. The method of claim 1, wherein the analysis includes an average of at least the first recorded value and the second recorded value.

7. The method of claim 6, further comprising providing the alert in response to the average exceeding a threshold value.

8. The method of claim 1, further comprising providing the alert during operation of an electrified vehicle including a traction battery.

9. The method of claim 1, further comprising providing the alert during manufacturing of the array and prior to installation of the array within an electrified vehicle.

10. An assembly, comprising:
a controller configured to initiate an alert in response to an analysis of an array that includes at least a first recorded value and a second recorded value, the first recorded value corresponding to an electrical parameter of a battery joint under a first set of operating conditions, the second recorded value corresponding to the electrical parameter of the battery joint under a second set of operating conditions, the controller configured to position the first recorded value within the array according to the first set of operating conditions and to position the second recorded value within the array according to the second set of operating conditions, the controller further configured to update the array by replacing the first recorded value with a new recorded value corresponding to the electrical parameter of the battery joint under the first set of operating conditions, wherein the array is a three dimensional array having a first dimension representative of a location of the battery joint, a second dimension representative of current at the battery joint, and a third dimension representative of temperature at the battery joint.

11. The assembly of claim 10, further comprising a traction battery that provides at least a portion of the battery joint.

12. The assembly of claim 10, wherein the battery joint comprises a welded connection between a busbar and a terminal of a battery cell.

13. The assembly of claim 10, wherein the battery joint comprises a threaded connection between a busbar and a terminal of a battery cell.

14. The assembly of claim 10, wherein the electrical parameter is representative of a resistance of the battery joint.

15. The assembly of claim 10, wherein the alert indicates change in an integrity of a battery joint.

16. The method of claim 1, wherein the first recorded value is replaced with the new recorded value during the updating if the new recorded value exceeds the first recorded value stored within the array.

* * * * *